(12) United States Patent
Flaibani et al.

(10) Patent No.: US 7,733,153 B2
(45) Date of Patent: Jun. 8, 2010

(54) HIGH SPEED LEVEL SHIFTER

(75) Inventors: Marco Flaibani, Udine (IT); Emanuele Bodano, Padua (IT); Cristian Garbossa, Bressanone (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/058,085

(22) Filed: Mar. 28, 2008

(65) Prior Publication Data
US 2008/0238525 A1    Oct. 2, 2008

(30) Foreign Application Priority Data
Mar. 28, 2007    (EP)    .................. 07006436

(51) Int. Cl.
H03L 5/00    (2006.01)
(52) U.S. Cl. .............................. 327/333; 326/80; 326/81
(58) Field of Classification Search .................. 327/333; 326/80, 81
See application file for complete search history.

(56) References Cited

U.S. PATENT DOCUMENTS

| 6,201,429 B1 | 3/2001 | Rosenthal | |
| 6,417,716 B1* | 7/2002 | Riccio | 327/333 |
| 6,556,047 B2* | 4/2003 | Debaty | 326/68 |
| 2002/0000878 A1 | 1/2002 | Berkhout | |
| 2004/0130923 A1 | 7/2004 | Yin Ho et al. | |
| 2006/0091907 A1 | 5/2006 | Khan | |
| 2006/0208759 A1* | 9/2006 | Nojiri | 326/81 |

FOREIGN PATENT DOCUMENTS

| DE | 102 50 936 B3 | 4/2004 |
| EP | 0 789 456 A1 | 8/1997 |
| WO | WO 2006/033638 | 3/2006 |

OTHER PUBLICATIONS

Consoli, A., et al., "An Innovative EMI Reduction Design Technique in Power Converters," IEEE Transactions on Electromagnetic Compatibility, Nov. 1996, pp. 567-575, vol. 38, No. 4.
Galluzo, A., et al., "Switching Characteristic Improvement of Modern Gate Controlled Devices," Fifth European Conference on Power Electronics and Applications, vol. 2, Sep. 13-16, 1993, pp. 374-379, The European Power Electronics Association.

* cited by examiner

Primary Examiner—Kenneth B. Wells
(74) Attorney, Agent, or Firm—Slater & Matsil, L.L.P.

(57) ABSTRACT

The invention relates to a level shifter comprising an input stage having a parasitic capacitance and a first input terminal for applying an input signal, a limiter stage having a second input terminal for applying a switching signal, wherein said input stage is coupled between a first supply terminal and said limiter stage, an output stage being coupled between a second supply terminal and said limiter stage and providing an output signal which is a level shifted version of said input signal, and a current source being adapted for injecting a current pulse into said parasitic capacitance dependent on variations of said switching signal over time.

21 Claims, 4 Drawing Sheets

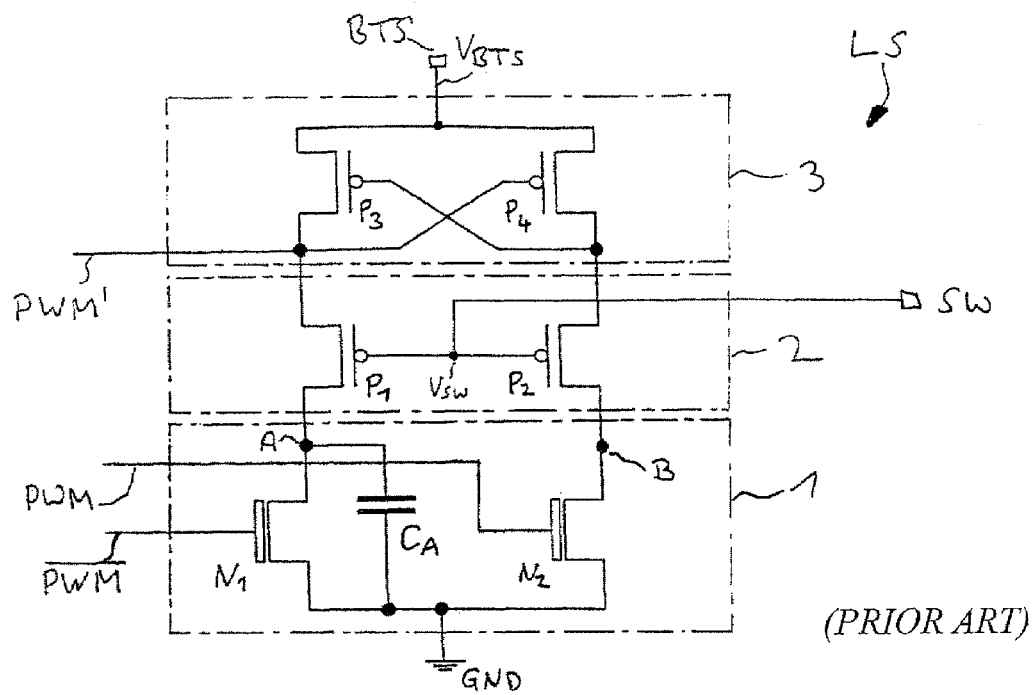
FIG 2 *(PRIOR ART)*
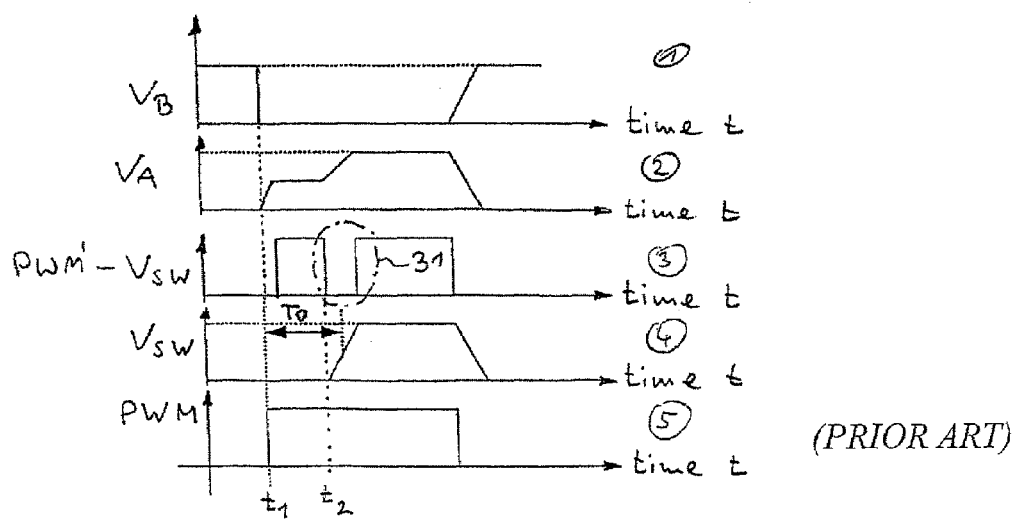
FIG 3 *(PRIOR ART)*

HIGH SPEED LEVEL SHIFTER

This application claims priority to European Patent Application 07 006 436.5, which was filed Mar. 28, 2007 and is incorporated herein by reference.

TECHNICAL FIELD

The invention relates to a level-shifter for transferring electric signals related to a first electric potential to electric signals related to a second electric potential.

BACKGROUND

Especially in high voltage systems, it is often necessary to transfer information in the form of electric signals, from a low side to a high side of an electric circuit, where in the low side of the circuit signals are related to a first electric potential (e.g., ground potential) and in the high side of the circuit signals are related to a second electric potential (e.g., a floating reference potential). One example is a high side semiconductor switch whose switching state is to be controlled by a control signal. The voltage level of the control signal in this case is not related to a fixed potential (further referred to as ground potential, but not limited to a ground potential), but with respect to the potential of a circuit-node common to the switch and the load. That is, the voltage level of the control signal is related to a floating reference potential that depends on the switching state of the high side semiconductor switch.

Critical parameters for level-shifters are power consumption, delay time, and noise robustness. In view of power consumption DC level-shifters can be very efficient, because power is only dissipated during switching operation of the level shifter, i.e., during the transmission from one logic level to another logic level. Concerning noise robustness it is expected that level-shifters do not erroneously change their state due to noise and parasitic inductive or capacitive coupling (i.e., cross-talk).

Level shifters of this kind conventionally have an input stage receiving an input signal to be level-shifted, a limiter stage receiving a floating reference potential which usually is the potential of the switched circuit-note mentioned above, and an output stage providing an output signal which is substantially a level-shifted (or inverted and level-shifted) version of the input signal.

The delay between the input and the output signal caused by the level-shifter is due to the charging and the discharging of parasitic capacitors in the input stage. The capacitance values of these parasitic capacitors can not directly be influenced by circuit design.

SUMMARY OF THE INVENTION

A first aspect of the present disclosure relates to a level shifter that includes an input stage having a parasitic capacitance and a first input terminal for applying an input signal, a limiter stage having a second input terminal for applying a switching signal (i.e., a floating reference potential), wherein the input stage is connected between a first supplied terminal providing a first supply potential (e.g., ground potential) and the limiter stage. An output stage is connected between a second supplied terminal (providing e.g., a bootstrap supply potential) and the limiter stage and providing an output signal which is a level-shifted version of the input signal. The level shifter further comprises a current source being adapted for injecting a current pulse into the parasitic capacitance depended on variation of the switching signal over time.

The actual voltage level over ground of the switching signal defines the floating referenced potential for the level-shifted output signal, i.e., the level-shifted output signal is measured with respect to the floating referenced potential.

According to an embodiment the current source may be adapted for detecting an edge of the switching signal and for injecting a current pulse into the parasitic capacitance of the input stage when an edge is detected. For edge detection the current source can comprise a current mirror having a first and a second branch, wherein the first branch is electrically connected to the first supply potential (e.g., ground potential) via a capacitor and the second branch is connected to the parasitic capacitance. The current mirror is supplied by a floating supply potential (e.g., a bootstrap supply potential) provided by the second supply terminal. The floating supply potential is—like the level-shifted output signal—measured with respect to the floating reference potential, i.e., the potential of the switching signal.

An edge in the switching signal results in a "pulse" in the gradient of the potential of the switching signal (i.e., the floating reference potential) and also a pulse in the gradient of the second supply potential (e.g., the bootstrap supply potential). The gradient in the second supply potential results in a current pulse in the first branch of the current mirror charging the capacitor located in the first branch of the current mirror. This current is "copied" to the second branch of the current mirror which is connected to the parasitic capacitance. The parasitic capacitance is thus quickly (pre-) charged by a short current pulse due to a gradient in the second supply potential, i.e. due to a variation over time (especially an edge) of the switching signal. The charging is considerably accelerated and the delay time of the level-shifter reduced.

Another aspect is the use of the level-shifter described above in a circuit arrangement comprising a high-side semiconductor switch, a floating driver circuit connected to a control terminal of the semiconductor switch for controlling the switching state of the semiconductor switch, and a level shifter as described above, wherein the level shifter is connected between a first input terminal for applying an input signal and the floating driver circuit.

BRIEF DESCRIPTION OF THE DRAWINGS

Examples will be explained in more detail based on the following Figures. In the Figures, unless otherwise indicated, the same reference notations refer to the same components or the same signals of the same meaning.

FIG. 2 shows a level-shifter comprising an input stage receiving an input signal, a limiter stage, and an output stage comprising an output signal which is a level-shifted version of the input signal;

FIG. 3 shows timing diagrams of relevant signals in the level-shifter depicted in FIG. 2;

DETAILED DESCRIPTION OF ILLUSTRATIVE EMBODIMENTS

Figure 1:
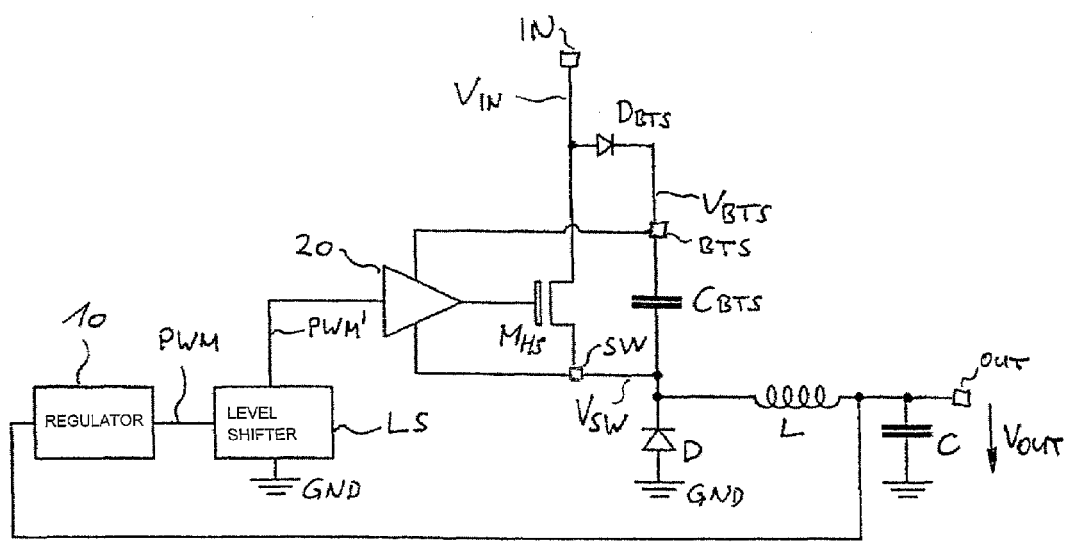
FIG. 1 shows a buck-converter comprising a high-side semiconductor switch, a floating driver logic and a level-shifter.

FIG. 1 shows the basic implementation of a buck converter comprising a high-side semiconductor switch MHS, a floating driver circuit 20 for controlling the high-side semiconductor switch MHS, a level shifter LS receiving an input signal PWM and providing an output signal PWM' being a level shifted version of the input signal PWM. The buck converter further comprises a bootstrap supply circuit with a bootstrap capacitor CBTS and a bootstrap diode DBTS and an output circuit comprising an inductor L connected in series with a capacitor C and a free-wheeling diode D connected in parallel to the series circuit of the inductor L and the capacitor C. The output voltage Vout of the buck converter is provided by the capacitor C at node out and received by a regulator 10 which provides as an output signal the input signal PWM for the level shifter.

The semiconductor switch MHS may be any known semiconductor switch, e.g., a MOSFET, an IGBT, a bipolar transistor, etc. In the case of FIG. 1 an n-channel MOS transistor MHS having a drain terminal, a source terminal, and a gate terminal is used. The floating driver circuit receives the level shifter output signal PWM' from the level shifter LS and provides a gate voltage for the semiconductor switch MHS measured with respect to the potential of the source terminal also referred to as the switching terminal SW in the following. The free wheeling diode D as well as the series circuit of inductor L and capacitor C are connected between the switching terminal and a first supply terminal GND (e.g., a ground terminal). The bootstrap supply circuit, i.e., the series circuit of the bootstrap diode DBTS and the bootstrap capacitor CBTS, is connected between the switching terminal SW and a third supply terminal IN providing a supply potential Vin, wherein the bootstrap diode DBTS is connected to the third supply terminal IN and the bootstrap capacitor CBTS is connected to the switching terminal SW. The common node of the bootstrap diode DBTS and the bootstrap capacitor CBTS forms a second supply terminal BTS providing the bootstrap supply potential VBTS also referred to as the second supply potential in the following. The floating driver circuit 20 and the level shifter LS is supplied by the bootstrap supply potential VBTS, the drain terminal of the semiconductor switch MHS receives the third supply potential Vin at node in. The regulator 10 receiving the output voltage Vout provides the input signal PWM such that the output voltage Vout is regulated to a desired value.

A crucial element in the buck converter shown in FIG. 1 is the level shifter LS. A simple DC level shifter is now described with reference to FIG. 2. The level shifter LS comprises an input stage 1 connected to a first supply terminal i.e., to a ground terminal GND, an output stage 3 connected to the second supply terminal, i.e., the bootstrap supply terminal BTS, and a limiter stage 2 connected between the input stage 1 and the output stage 3. The input stage comprises a first and a second transistor N1 and N2, in the shown embodiment n-channel MOS transistors, each having a gate terminal, a drain terminal, and a source terminal. The source terminals of the transistors N1 and N2 are both connected to the ground terminal GND, the drain terminal of the first transistor N1 is connected to a circuit node A and the drain terminal of the second transistor N2 is connected to a second circuit node B. The gate terminal of the second transistor N2 receives the input signal PWM and the gate terminal of the first transistor N1 receives an inverted version /PWM of the input signal PWM. For providing this inverted input signal, the input stage can also comprise an inverter (not shown).

The first circuit node A and the ground terminal GND are coupled by a parasitic capacitance CA which is inherent to the first transistor N1. The value of this parasitic capacitance CA can not be influenced by circuit design and depends on production technology used for implementing the circuit in a semiconductor chip. The parasitic capacitance CA is not the only parasitic capacitance in the circuit. Strictly speaking every node of the circuit is coupled to each other node via a parasitic capacitance, but concerning the level shifter of FIG. 2, the parasitic capacitance CA is the most relevant one.

The limiter stage 2 comprises a third transistor P1 and a fourth transistor P2 which are in the shown embodiment p-channel MOS transistors each having a source terminal, a drain terminal and a gate terminal. The gate terminal of the third and the fourth transistor P1 and P2 are connected to each other receiving a floating reference potential, i.e., a switching signal VSW, provided by the switching terminal SW (see, FIG. 1). The drain terminal of the third transistor P1 and drain terminal of the fourth transistor P2 are connected to the circuit nodes A and B, respectively, thus connecting the input stage 1 and limiter stage 2. The source terminals of the third and fourth transistor P1 and P2 are connected to the output stage 3.

The output stage 3 comprises a fifth transistor P3 and sixth transistor P4, both of which are implemented as p-channel MOS transistors in the shown embodiment. The fifth and the sixth transistor P3 and P4 both have a drain terminal, a source terminal, and a gate terminal, wherein the drain-source paths of the fifth and the sixth transistor P3 and P4 are connected in series to drain-source paths of the third and the fourth transistors P1 and P2, respectively. The source terminals of both transistors P3 and P4 are connected to the second supply terminal BTS which provides the second (floating) supply potential, i.e., the bootstrap supply potential VBTS. The gate terminal of the sixth transistor P4 is connected to the drain terminal of the fifth transistor P3 and vice versa. The level shifted output signal PWM' is provided by the drain terminal of the fifth transistor P3, wherein this output signal PWM' is floating and measured with respect to the floating reference potential VSW (i.e., the switching signal) received by the limiter stage 2.

The function of a level shifter as depicted in FIG. 2 will now be explained with reference to timing diagrams shown in FIG. 3.

As an example a rising edge occurs in the input signal PWM at a time $t_1$, as shown in timing diagram 5 of FIG. 3. Before the rising edge at a time $t_1$ the first transistor N1 and the sixth transistor P4 are at an on-state, the second transistor N2 and the fifth transistor P3 are in an off-state. Circuit node A is pulled to a low level near to ground potential GND, circuit node B is pulled up to a level near to the bootstrap supply potential VBTS. The floating reference potential VSW, i.e., the switching signal, also is at a low level. At time $t_1$ the input signal PWM and the inverted input signal /PWM are inverted, the first transistor N1 is switched to an off-state, the second transistor N2 is switched to an on-state, thus pulling circuit node B to a low level near to ground potential GND. As a consequence the gate of the fifth transistor P3 in the output stage is also pulled down and the fifth transistor P3 is switched to an on-state. The current flowing through the fifth transistor P3 has to flow also through the third transistor P1. Since the first transistor N1 is now in an off-state the current has to charge the parasitic capacitance CA until the level shifted output signal PWM' reaches a high level near to the bootstrap supply potential VBTS.

The reaction time of the process described above depends on the capacitance value of the parasitic capacitance CA and on-resistance of the second transistor N2 and the fifth transistor P3. The rising edge in the input signal PWM comes shortly after the rising edge in the output signal PWM' as shown in timing diagrams 3 and 5 respectively. As the level of the output signal PWM' goes up, the circuit node A is also pulled up approximately to the bootstrap supply potential VBTS and the gate of the sixth transistor P4 which receives the output signal PWM' at its gate terminal is consequently switched off. In this condition the fourth transistor P2 is in an off-state and its source at a low level near the floating reference potential VSW, whereas the third transistor P1 is in an on-state and its source at a high level near the bootstrap supply voltage VBTS (deep triode region of P1).

The output signal PWM' of the level shifter LS now switches on the high side semiconductor switch MHS (see FIG. 1) and, consequently, the switching signal VSW (i.e., the floating reference potential) is switched to a high level after a delay time TD (see timing diagram 4 of FIG. 3). The bootstrap supply potential VBTS rises by the same value as the switching signal VSW.

The rise of the floating reference potential VSW (and the resulting rise of the bootstrap supply voltage VBTS) results in a spurious glitch 31 at a time $t_2$ in the output signal PWM' as shown in timing diagram 3 of FIG. 3. Since the parasitic capacitance CA can not be charged as quick as the potential of the switching signal VSW rises, the output signal PWM' is pulled down until the parasitic capacitance CA is charged to a potential near the floating bootstrap supply potential VBTS. Due to this spurious glitch 31 in the output signal PWM' the high side semiconductor switch MH1 (see FIG. 1) can be erroneously switched off which leads to a malfunction of the hole circuit (in the case of FIG. 1 the buck converter).

Figure 4:
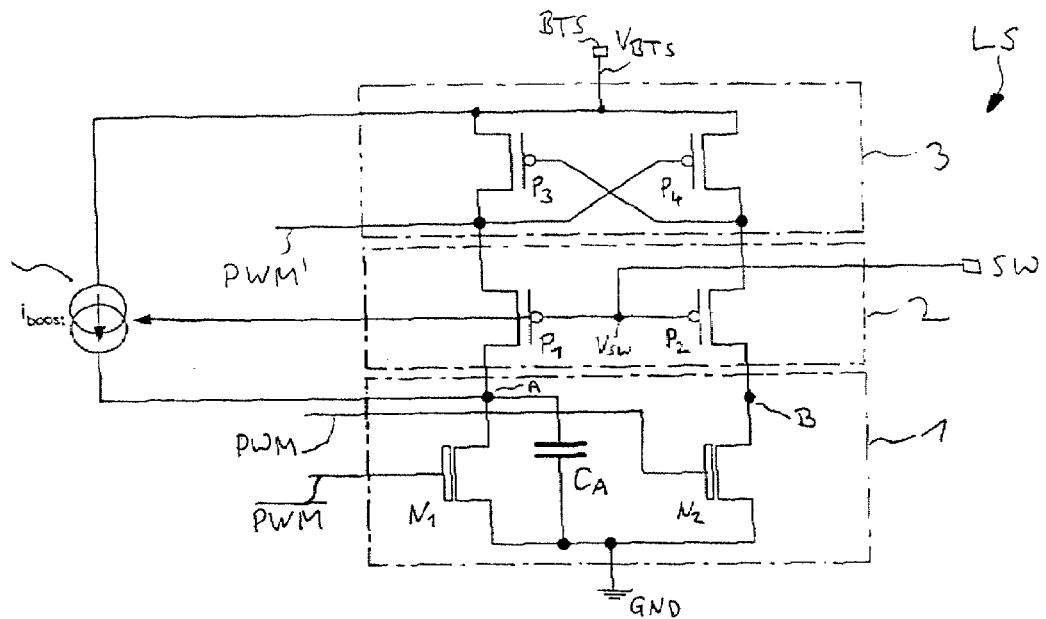
FIG. 4 shows one embodiment of a level-shifter, comprising an input stage receiving an input signal, a limiter stage, and an output stage providing an output signal, and a current source being adapted for charging a parasitic capacitance of the input stage.

FIG. 4 shows one embodiment of the invention that helps to avoid the aforementioned spurious glitches 31 in the output signal PWM'. The level shifter depicted in FIG. 4 differs from the one depicted in FIG. 2 in a current source 22, which is connected to the parasitic capacitance, CA. Such current source 22 can inject a charging current $i_{BOOST}$ into the parasitic capacitance CA, with the current $i_{BOOST}$ depending on the voltage level of the switching signal VSW, i.e., on the floating reference potential. In case of FIG. 4, the current source 22 is supplied through the second supply terminal BTS, the current source 22 could also be supplied by any other supply potential high enough to provide the current $i_{BOOST}$.

In one embodiment the current source 22 is adapted for detecting an edge in the switching signal VSW and for injecting a pulse current $i_{BOOST}$ into the parasitic capacitance CA when an edge in the switching signal VSW has been detected. The pulse current $i_{BOOST}$ "boosts" (accelerates) the charging of the parasitic capacitance, thus avoiding the spurious glitch in the output signal PWM'.

Figure 5:
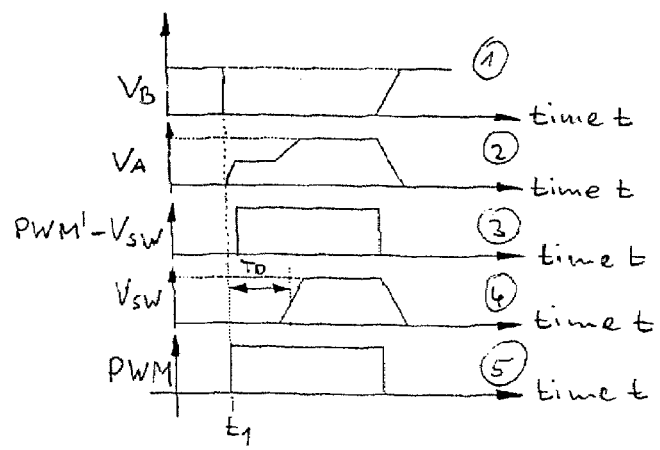
FIG. 5 shows timing diagrams of relevant signals in the level-shifter depicted in FIG. 4.

FIG. 5 shows the timing diagrams for the relevant signals in the level shifter of FIG. 4. The only difference to the timing diagrams of FIG. 3 is in the third timing diagram of FIG. 5 showing, that the output signal PWM' remains stable, although during a rising edge in the floating reference potential, i.e., in the switching signal VSW. Due to the pulse current $i_{BOOST}$ injected into the parasitic capacitance CA during the change in the switching signal VSW glitches are avoided.

Figure 6:
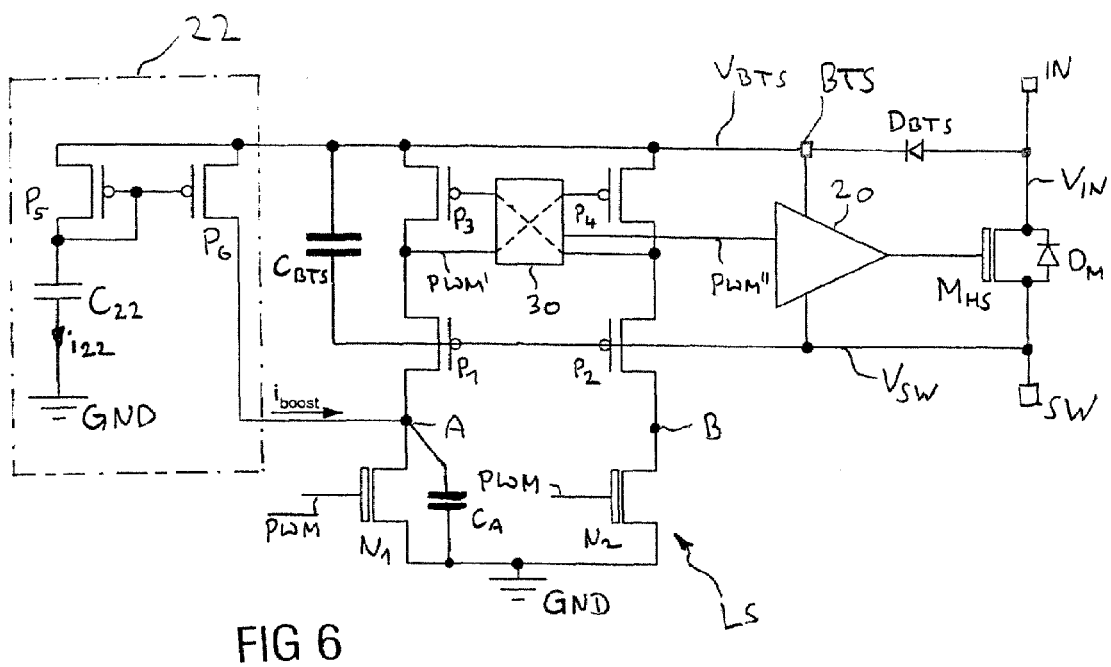
FIG. 6 shows another embodiment of a level-shifter in more detail.

FIG. 6 shows another embodiment of the invention comprising the level shifter of FIG. 4 with the current source 22 being illustrated in more detail, with a floating driver circuit 20, a high side semiconductor switch MHS, and a bootstrap supply circuit (DBTS, CBTS). The level shifter LS itself only differs from the level shifter of FIG. 4 in the fast logic circuit 30 being connected to the gates of the fifth and the sixth transistor P3 and P4 and providing an output signal PWM'', which is essentially equal to the output signal PWM' of the level shifter in FIG. 4. The fast logic 30 (described, e.g., in DE 102 50 936 B3) further reduces the delay between the input signal PWM and the output signal PWM'' (not shown in detail). However, the fast logic 30 is optional and a simple circuit according to FIG. 4 can be used instead. The output signal PWM'' of the level shifter LS is received by the floating driver 20 which controls the gate voltage of a high side semiconductor switch MHS. The floating supply potential VBTS needed for the floating components and for the level shifter LS is—analogous to the circuit shown in FIG. 1—provided by a bootstrap supply circuit comprising the diode DBTS and the bootstrap capacitor CBTS. The switching terminal SW providing the switching signal VSW (which forms the floating reference potential for the level shifter LS) can be connected to an output circuit (not shown), for example, to a series circuit of an inductor and an capacitor in order to form a buck converter like the circuit in FIG. 1.

A more detailed embodiment of the current source 22 is depicted in FIG. 6. The current source comprises a current mirror with a first branch and a second branch. The first branch is formed by a seventh transistor P5 and an eighth transistor P6 each having a gate terminal, a drain terminal, and a source terminal. The source terminals of both transistors (in the case of FIG. 6 two p-channel MOS-transistors) are connected to the floating supply terminal BTS, the gate terminals of transistors P5 and P6 are connected to each other and to the drain terminal of the seventh transistor P5. The drain terminal of the seventh transistor P5 is connected to the first supply terminal (ground potential GND) via a capacitor C22 and the drain terminal of the eighth transistor P6 is connected with the parasitic capacitance CA of the input stage of the level shifter LS.

The bootstrap capacitor CBTS keeps the potential difference between the switching signal VSW (floating reference potential) and the bootstrap supply potential VBTS approximately constant, that is, if the level of the switching signal VSW rises with respect to ground, the bootstrap supply potential VBTS will also rise by the same potential value with respect to ground as the level of the switching signal VSW. As a result a rising edge in the switching signal VSW will result in a rising edge in the bootstrap supply potential VBTS. This change in the bootstrap supply potential VBTS is equivalent to a non-zero value in the gradient of the bootstrap supply potential VBTS which results in a current i22 charging the capacitor C22 of the current source 22. The current i22 charging the capacitor C22 has only current values different from zero during a change in the level of the switching signal VSW. The charging current i22 is "copied" to the second branch providing a current $i_{BOOST}$ of the current mirror providing a current $i_{BOOST}$ charging the parasitic capacitance CA connected to the circuit node A of the level shifter LS. To sum it up, the current source 22 provides a current pulse $i_{BOOST}$ (which is proportional to current i22) during a change in the level of the switching signal VSW, wherein the current $i_{BOOST}$ quickly charges the parasitic capacitance CA, thus avoiding glitches as mentioned with the description of FIG. 4.

What is claimed is:
1. A level shifter comprising:
an input stage having a parasitic capacitance and a first input terminal for receiving an input signal;
a limiter stage having a second input terminal for receiving a switching signal, wherein said input stage is coupled between a first supply terminal and said limiter stage;

an output stage being coupled between a second supply terminal and said limiter stage, the output stage providing an output signal that is a level shifted version of said input signal; and a current source adapted to inject a current pulse into said parasitic capacitance dependent on variations of said switching signal over time.

2. The level shifter of claim 1, wherein said input stage comprises a first transistor and a second transistor each having a control terminal, a first load terminal and a second load terminal, wherein said second load terminals of said first and said second transistors are both coupled to said first supply terminal for receiving a first supply potential, and wherein said first load terminals of said first and said second transistors are coupled to a first and a second node, respectively.

3. The level shifter of claim 2, wherein said limiter stage comprises a third transistor and a fourth transistor each having a control terminal and a load path, wherein said load paths of said third and said fourth transistor are coupled to said first and said second nodes, respectively, and wherein said control terminals of said third and said fourth transistor are coupled to said second input terminal.

4. The level shifter of claim 3, wherein said output stage comprises a fifth transistor and a sixth transistor each having a control terminal and a load path, wherein said load paths of said fifth and sixth transistors are coupled in series with said load paths of said third and fourth transistors, respectively, and wherein said control terminal of said fifth transistor is coupled to a load terminal of said sixth transistor and vice versa.

5. The level shifter of claim 4, wherein first load terminals of said fifth and said sixth transistors are coupled to said second supply terminal, and said output signal is provided by a second load terminal of said fifth transistor.

6. The level shifter of claim 1, wherein said current source is adapted to detect an edge of said switching signal and to inject a current pulse into said parasitic capacitance when the edge is detected.

7. The level shifter of claim 1, wherein said current source comprises a current mirror having a first branch and a second branch, said first branch being electrically coupled to said first supply potential via a capacitor and said second branch being coupled to said parasitic capacitance.

8. The level shifter of claim 7, wherein said current mirror comprises a seventh transistor and an eighth transistor, said seventh transistor being coupled to said capacitor and said eighth transistor being coupled to said parasitic capacitance.

9. The level shifter of claim 7, wherein said capacitor has a capacitance value that is chosen such that in case of a rising edge in said switching signal, said current pulse is delivered to said parasitic capacitance, the total charge of said current pulse sufficing to charge said parasitic capacitance substantially up to its steady state voltage level.

10. A power converter comprising:
the level shifter of claim 1;
a floating driver circuit coupled to the output signal of the level shifter;
a semiconductor switch comprising
a control node coupled to an output of the floating circuit driver,
a second node coupled to a supply potential, and
a third node coupled to a power supply output; and
a regulator coupled between the power supply output and the level shifter, the regulator producing a pulse-width modulated signal.

11. A semiconductor arrangement comprising
a semiconductor switch;

a floating driver circuit coupled to a control terminal of said semiconductor switch for controlling a potential of said control terminal; and a level shifter coupled between a first input terminal for applying an input signal and said floating driver circuit, the level shifter comprising:

an input stage having a parasitic capacitance and a first input terminal for receiving an input signal;

a limiter stage having a second input terminal for receiving a switching signal, wherein said input stage is coupled between a first supply terminal and said limiter stage;

an output stage being coupled between a second supply terminal and said limiter stage, the output stage providing an output signal that is a level shifted version of said input signal, the output signal being coupled to an input of the floating driver circuit; and a current source adapted to inject a current pulse into said parasitic capacitance dependent on variations of said switching signal over time.

12. The semiconductor arrangement of claim 11, further comprising a bootstrap supply circuit coupled to a third supply terminal for applying a third supply potential and being adapted to provide a second supply potential at said second supply terminal.

13. The semiconductor arrangement of claim 11, wherein said input stage comprises a first transistor and a second transistor each having a control terminal, a first load terminal and a second load terminal, wherein said second load terminals of said first and said second transistors are both coupled to said first supply terminal for receiving a first supply potential, and wherein said first load terminals of said first and said second transistors are coupled to a first and a second node respectively.

14. The semiconductor arrangement of claim 13, wherein said limiter stage comprises a third transistor and a fourth transistor, each having a control terminal and a load path, wherein said load paths of said third and said fourth transistor are coupled to said first and said second nodes, respectively, and wherein said control terminals of said third and said fourth transistor are coupled to said second input terminal.

15. The semiconductor arrangement of claim 14, wherein said output stage comprises a fifth transistor and a sixth transistor, each having a control terminal and a load path, wherein said load paths of said fifth and sixth transistors are coupled in series with said load paths of said third and fourth transistors respectively, and wherein said control terminal of said fifth transistor is coupled to a load terminal of said sixth transistor and vice versa.

16. The semiconductor arrangement of claim 15, wherein first load terminals of said fifth and said sixth transistors are coupled to said second supply terminal, and said output signal is provided by a second load terminal of said fifth transistor.

17. The semiconductor arrangement of claim 11, wherein said current source is adapted to detect an edge of said switching signal and to inject a current pulse into said parasitic capacitance when the edge is detected.

18. The semiconductor arrangement of claim 11, wherein said current source comprises a current mirror having a first branch and a second branch, said first branch being electrically coupled to said first supply potential via a capacitor and said second branch being coupled to said parasitic capacitance.

19. The semiconductor arrangement of claim 18, wherein said current mirror comprises a seventh transistor and an eighth transistor, said seventh transistor being coupled to said capacitor and said eighth transistor being coupled to said parasitic capacitance.

20. The semiconductor arrangement of claim 18, wherein said capacitor has a capacitance value that is chosen such that in case of a rising edge in said switching signal, said current pulse is delivered to said parasitic capacitance, the total charge of said current pulse sufficing to charge said parasitic capacitance substantially up to its steady state voltage level.

21. A circuit comprising:
- a first transistor with a control terminal coupled to an input node, the first transistor having a current path between a first supply terminal and a first circuit node;
- a second transistor with a control terminal coupled to an inverted input node, the second transistor having a current path between the first supply terminal and a second circuit node;
- a third transistor with a control terminal coupled to a switching signal node, the third transistor having a current path between the first circuit node and a third circuit node;
- a fourth transistor with a control terminal coupled to the control terminal of the third transistor, the fourth transistor having a current path between the second circuit node and a fourth circuit node;
- a fifth transistor with a control terminal coupled to the fourth circuit node, the fifth transistor having a current path between the third circuit node and a bootstrap supply potential node;
- a sixth transistor with a control terminal coupled to the third circuit node, the sixth transistor having a current path between the fourth circuit node and the bootstrap supply potential node; and
- a current source coupled between the second circuit node and the bootstrap supply potential node to inject a current into a parasitic capacitance coupled to the second circuit node, the current being dependent on variations of a signal coupled to the signal switching node.

* * * * *